United States Patent
Shu et al.

(10) Patent No.: US 12,406,107 B1
(45) Date of Patent: *Sep. 2, 2025

(54) ANNOTATION TOOLS FOR RECONSTRUCTING THREE-DIMENSIONAL ROOF GEOMETRY

(71) Applicant: ECOPIA TECH CORPORATION, Toronto (CA)

(72) Inventors: Yuanming Shu, Toronto (CA); Shuo Tan, Campbell, CA (US); Dawei Zai, Toronto (CA)

(73) Assignee: ECOPIA TECH CORPORATION, Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 19/173,798

(22) Filed: Apr. 8, 2025

Related U.S. Application Data

(63) Continuation of application No. 18/402,239, filed on Jan. 2, 2024.

(60) Provisional application No. 63/498,173, filed on Apr. 25, 2023, provisional application No. 63/486,479, filed on Feb. 23, 2023.

(51) Int. Cl.
*G06F 7/48* (2006.01)
*G06F 30/12* (2020.01)
*G06F 30/13* (2020.01)

(52) U.S. Cl.
CPC ............. *G06F 30/13* (2020.01); *G06F 30/12* (2020.01)

(58) Field of Classification Search
CPC ................................. G06F 30/13; G06F 30/12
See application file for complete search history.

(56) References Cited

U.S. PATENT DOCUMENTS

| | | | |
|---|---|---|---|
| 7,149,346 B2* | 12/2006 | Oniyama | G06F 30/13 382/285 |
| 7,509,241 B2* | 3/2009 | Guo | G06T 17/10 703/2 |
| 8,170,840 B2 | 5/2012 | Pershing | |
| 8,209,152 B2 | 6/2012 | Pershing | |
| 8,542,880 B2 | 9/2013 | Thornberry et al. | |
| 8,818,770 B2 | 8/2014 | Pershing | |
| 8,977,520 B2 | 3/2015 | Stephens et al. | |

(Continued)

FOREIGN PATENT DOCUMENTS

| | | |
|---|---|---|
| AU | 2013203507 A1 | 5/2013 |
| EP | 2251833 A2 | 11/2010 |

OTHER PUBLICATIONS

PCT/IB2024/050218, International Search Report, Apr. 3, 2024.
PCT/IB2024/050218, Written Opinion of the International Searching Aurhotiy, Apr. 3, 2024.

*Primary Examiner* — Nithya J. Moll
(74) *Attorney, Agent, or Firm* — Damian Rolfe

(57) ABSTRACT

Methods and systems for generating geometric models of pitched roofs of buildings based on multiview imagery are provided. An example method involves establishing a three-dimensional coordinate space for the multiview imagery, displaying, through an annotation platform, multiview imagery depicting the pitched roof from different points of view, and providing, through the annotation platform, functionality for a user to define a perimeter of the pitched roof, define a ridge line of the pitched roof, and define at least part of a roof facet of the pitched roof by connecting the ridge line of the pitched roof to the perimeter of the pitched roof.

20 Claims, 8 Drawing Sheets

(56) References Cited

U.S. PATENT DOCUMENTS

| | | |
|---|---|---|
| 9,911,228 B2 | 3/2018 | Pershing et al. |
| 2010/0114537 A1* | 5/2010 | Pershing ................ G06T 11/60 |
| | | 703/1 |
| 2013/0211790 A1 | 8/2013 | Loveland et al. |
| 2014/0200861 A1* | 7/2014 | DeVito ................... G06F 30/13 |
| | | 703/2 |
| 2019/0138665 A1* | 5/2019 | Pershing .................. G06T 7/30 |
| 2022/0244833 A1 | 8/2022 | Milbert et al. |
| 2023/0169731 A1* | 6/2023 | Strader ................. G06V 10/44 |
| | | 345/419 |

\* cited by examiner

ANNOTATION TOOLS FOR RECONSTRUCTING THREE-DIMENSIONAL ROOF GEOMETRY

CROSS-REFERENCE TO RELATED APPLICATIONS

This application claims the benefit under 35 U.S.C. § 120 as a continuation of U.S. patent application Ser. No. 18/402,239, filed Jan. 2, 2024, which claims the benefit under 35 U.S.C. § 119 (e) of U.S. Provisional App. 63/486,479, filed Feb. 23, 2023, and U.S. Provisional App. 63/498,173, filed Apr. 25, 2023. The contents of each of the aforementioned applications are incorporated herein by reference in their entirety.

BACKGROUND

Geometric models are mathematical representations that can be used to model virtual and real-world structures and objects. Geometric models are used in a wide range of applications, including as three-dimensional models of buildings in geographic information systems (GIS), in software development and game design, including for augmented reality and virtual reality applications, among other applications.

Geometric models of real-world structures can be derived from real-world imagery. For example, a three-dimensional model of a building may be reconstructed from multiview imagery of the building by manually annotating the imagery with the major features of the building. Such geometric models can be represented in vector data as a set of geometric entities (e.g., polygons, lines, points) and constraints that model the geometric features of the structures.

DETAILED DESCRIPTION

The present disclosure describes various aspects of an annotation platform and an associated image processing engine. The annotation platform provides features that may be particularly useful for reconstructing geometric models of buildings with complex roof geometry. Complex roof geometry may be understood to refer to any three-dimensional roof structure that is more detailed than flat roof geometry, such as the geometry of a pitched roof residential home. This disclosure also provides an annotation procedure that may be particularly well-suited for annotating buildings with pitched roof geometry. The resulting geometric models may be suitable for use in Geospatial Information Systems (GIS), Computer-Aided Design (CAD), for augmented reality and virtual reality applications, among other applications.

Figure 1:
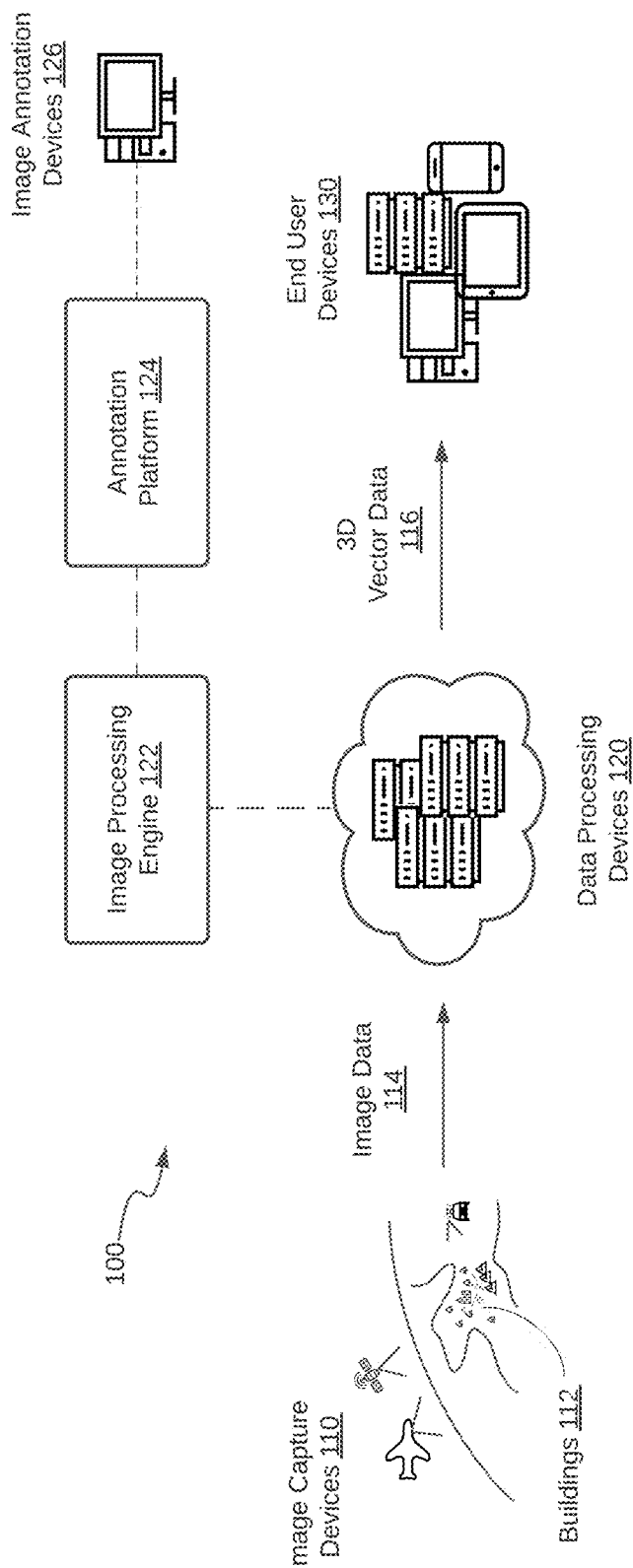
FIG. 1 is a schematic diagram of an example system for reconstructing three-dimensional roof geometry.

FIG. 1 is a schematic diagram of an example system 100 for reconstructing three-dimensional roof geometry. The system 100 includes one or more image capture devices 110 to capture image data 114 of an area of interest containing one or more buildings 112. An image capture device 110 may include any suitable sensor (e.g., camera) onboard an aircraft, satellite, drone, or other device capable of capturing imagery of an area of interest from a generally overhead point of view (i.e., geospatial imagery). An image capture device 110 may also include any suitable sensor (e.g., camera) onboard a motor vehicle (e.g., street view car), unmanned aerial vehicle (e.g., drone), personal device (e.g., smart phone), that is capable of capturing imagery of a building or other structure of interest from a more oblique perspective at a ground or near-ground level.

The image data 114 comprises the raw image data captured by such image capture devices 110 along with any relevant metadata, including camera parameters (e.g., focal length, lens distortion, camera pose, resolution), geospatial position information (e.g., latitude and longitude position), or other relevant metadata that may be provided. Depending on the types of image capture devices 110 involved, the imagery will generally include a set of oblique images depicting a building 112 from several different perspectives. However, in principle, any type of imagery depicting a building 112 from different perspectives may be used (including, e.g., a stereoscopic pair). The image data 114 may contain several batches of imagery covering the same area, from different points of view, which may have been captured on the same dates, or on different dates.

The system 100 further includes one or more data processing devices 120 to process the image data 114 to produce 3D vector data 116 as described herein. The data processing devices 120 include one or more computing devices, such as virtual machines or servers in a cloud computing environment comprising one or more processors for executing computing instructions. In addition to processing capabilities, the data processing devices 120 include one or more communication interfaces to receive/obtain/access the image data 114 and to output/transmit 3D vector data 116 through one or more computing networks and/or telecommunications networks such as the internet. Such computing devices further include memory (i.e., non-transitory machine-readable storage media) to store programming instructions that embody the functionality described herein.

The data processing devices 120 are configured to run (i.e., store, host or access) an image processing engine 122. The image processing engine cooperates with an annotation platform 124 as described herein. The image processing engine 122 and the annotation platform 124 are represented here as separate functional units that each may comprise one or more programs, software modules, or other set of non-transitory machine-readable instructions, to carry out the functionality described herein. However, this is for example purposes only, and it is to be understood that any of the functionality described herein may be performed by either functional unit or indeed by any combination of programs, software modules, or other sets of non-transitory machine-readable instructions.

The annotation platform 124 may be hosted by the data processing devices 120 in a manner accessible by image annotation devices 126 (e.g., through the internet), or the annotation platform 124 may be directly executable on image annotation devices 126. In any case, the image annotation devices 126 may include one or more computing devices configured to run (i.e., store, host or access) the annotation platform 124. The image annotation devices 126 therefore may include one or more user input devices (e.g., keyboard, mouse, touchscreen) to receive user input into the annotation platform 124 and a display device to allow a user to view a user interface provided by the annotation platform 124.

Figure 2:
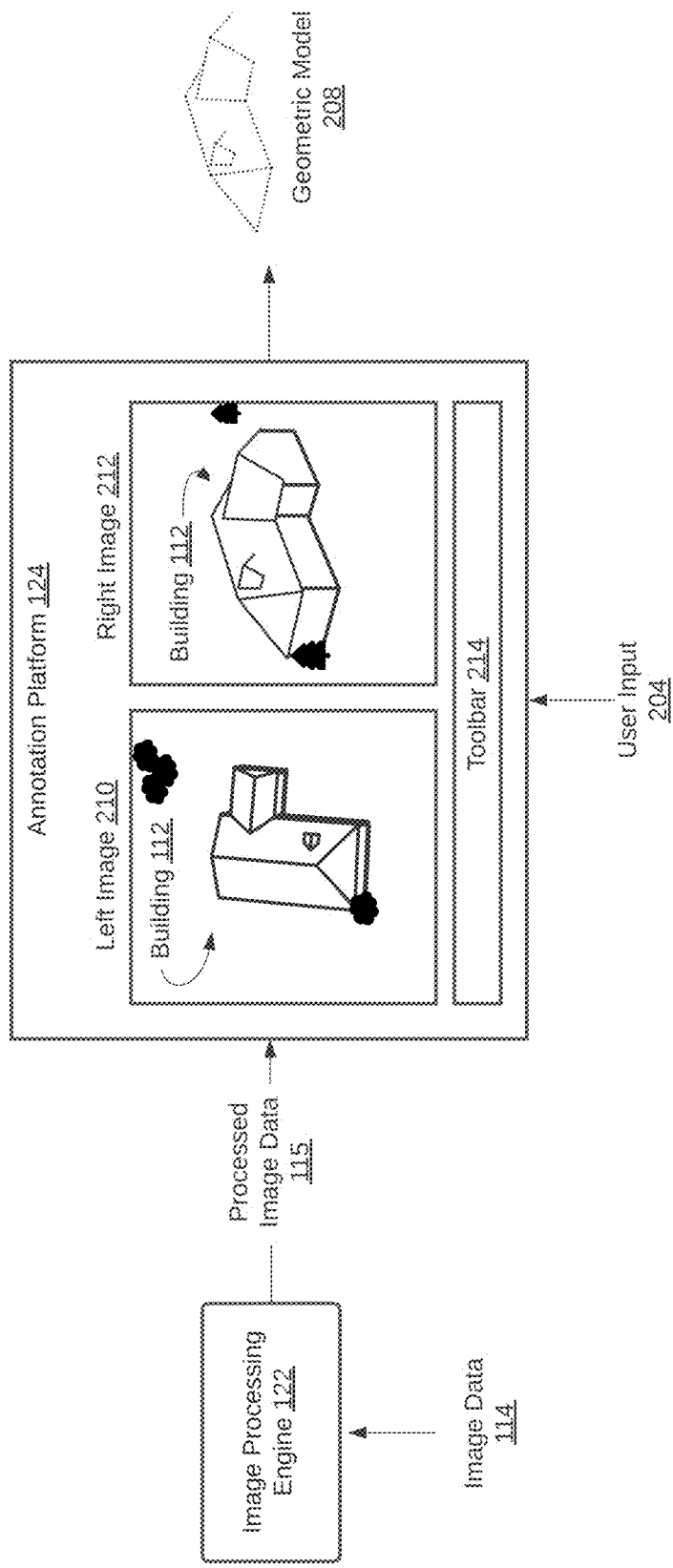
FIG. 2 is a schematic diagram of an example annotation platform for reconstructing three-dimensional roof geometry in cooperation with an image processing engine.

The 3D vector data 116 may generally understood to include any form of three-dimensional vector data representations of a building's structure as generated through the annotation platform 124, and in particular, including the three-dimensional structure of a building's complex roof geometry as described herein (e.g., the geometric model 208 of FIG. 2). The creation of the 3D vector data 116 through the use of the annotation platform 124 and the image processing engine 122 are described in detail later in this disclosure. Following the generation of the 3D vector data 116, the data processing devices 120 may provide such 3D vector data 116 to one or more end user devices 130. An end user device 130 may include one or more computing devices configured to run (i.e., store, host or access) one or more software programs to display, process, or otherwise use the 3D vector data 116 (e.g., a GIS viewer, CAD software). In some examples, an end user device 130 may include a display device and user interface and may allow a user to view and manipulate the 3D vector data 116. The end user devices 130 may use the 3D vector data 116 for any suitable application, such as to display models of the buildings 112 with complex roof geometry through a viewer, or for other purposes.

FIG. 2 is a schematic diagram showing the annotation platform 124 in cooperation with the image processing engine 122 in greater detail. The image processing engine 122 receives image data 114, which includes multiview imagery depicting at least one building 112, depicted here as a residential home, having complex pitched roof geometry. Based on the image data 114, the image processing engine 122 determines the relative camera pose of each of the cameras involved in capturing the multiview imagery and establishes a three-dimensional coordinate space in which the geometric model 208 of the building 112 will be built. This process may involve various feature matching and camera calibration techniques (e.g., bundle adjustment). This process may also involve selecting a subset of multiview imagery that is appropriate for use in the annotation process (e.g., based on image quality, angle of inclination, or other factors).

The image processing engine 122 thereby processes the image data 114 to produce processed image data 115 which contains such camera parameters and the multiview imagery to be used for the annotation process. The image processing engine 122 provides processed image data 115 to the annotation platform 124. The multiview imagery includes at least a first image (e.g., left image 210) and a second image (e.g., right image 212) which depict the pitched roof of the building 112 from different points of view.

The annotation platform 124 displays a user interface that contains a viewport for the left image 210 and a viewport for the right image 212. In some examples, the two images are displayed simultaneously and side-by-side for ease of viewing. However, in other examples, the two images may be displayed asynchronously (e.g., one after the other at different stages of an annotation process). In addition to the two images depicted here (the left image 210 and right image 212), the annotation platform 124 may have access to additional images captured from additional perspectives that may also be used in the annotation process, and may make these additional images available for annotation either simultaneously or in sequence with the other images, for example, by replacing the image in either viewport and making any annotations as appropriate.

The annotation platform 124 receives user input 204 that comprises instructions for annotating the imagery with a plurality of roof elements (e.g., roof perimeter, ridges, valleys, roof facets) that define the three-dimensional structure of the pitched roof. Using the determined camera parameters, annotations that are made over each image can be projected into the three-dimensional coordinate space. If such annotations are made over multiview imagery captured from different perspectives, the annotations made in one image can be adjusted in another image to locate the features in three-dimensional space.

A user may access a suite of annotation tools to make such annotations, some of which will be described later in this disclosure. For illustrative purposes, the annotation platform 124 is depicted as providing a toolbar 214 from which some of these annotation tools may be accessed. However, this is for illustration purposes only, and it is to be understood that some annotation tools may be accessed by a user inputting the requisite keyboard and/or mouse strokes and a user is not necessarily limited to accessing annotation tools through the toolbar 214.

The annotation platform 124 may internally process certain annotation data that reflects the annotations made by a user through user input 204. Generally, the annotation data will include a set of vector data representing the set of points and/or other geometric elements and constraints that define the various roof elements annotated by the user (e.g., a set of points and/or lines and/or polygons). In other examples, the annotation data may represent the annotation operations performed by the user (e.g., draw line operation). In either case, the annotation data can be interpreted as instructions for reconstructing the roof geometry as a geometric model 208. Given the annotation data and the relevant camera parameters, the annotation platform 124 generates the geometric model 208 of the building 112, which represents the three-dimensional structure of the pitched roof as situated in the three-dimensional coordinate space.

FIGS. 3A-3D depicts the annotation platform 124 at various stages of an annotation procedure that may be followed to annotate a building with pitched roof geometry. The annotation procedure described herein may be understood to be a particularly systematic and efficient procedure for capturing complex pitched roof geometry in an orderly and predictable manner using the annotation tools described herein. The steps of the annotation procedure are set out in a method 400 depicted in the flowchart of FIG. 4.

Figure 3A:
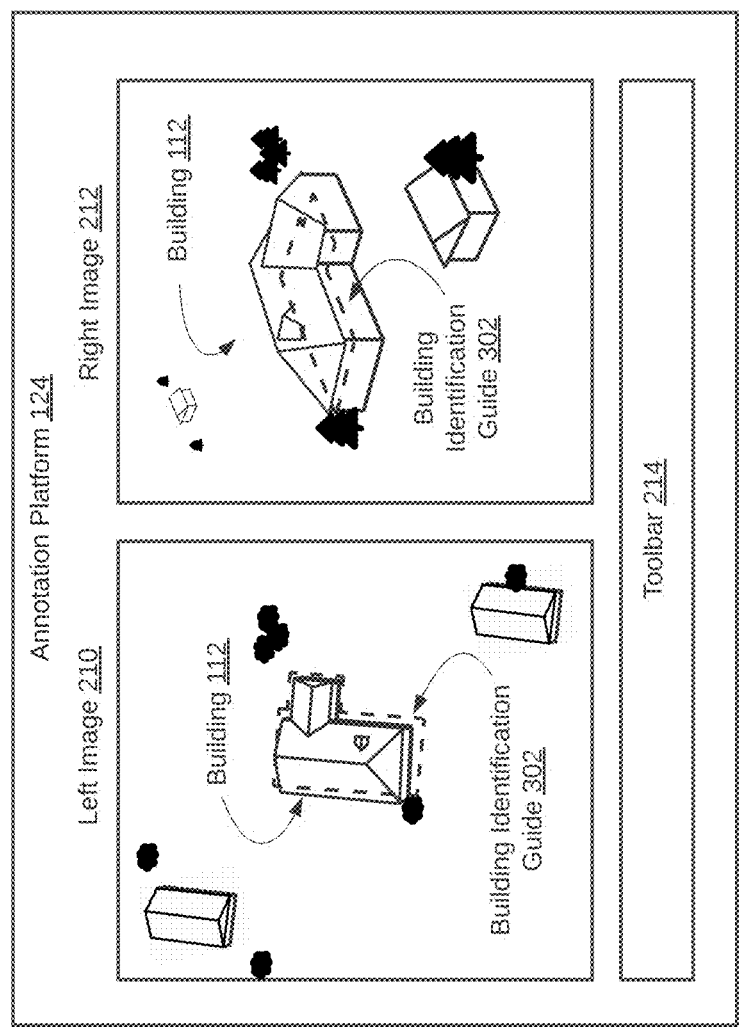
FIGS. 3A-3D are schematic diagrams showing an example annotation platform for reconstructing three-dimensional roof geometry in various stages of operation.
Figure 4:
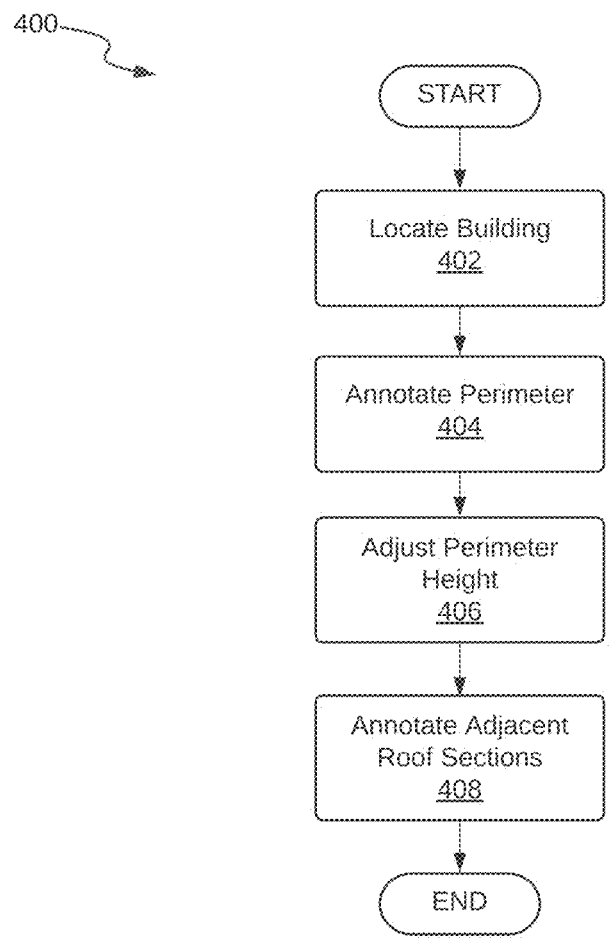
FIG. 4 is a flowchart of a method for annotating multiview imagery with the three-dimensional roof structure of a building with pitched roof geometry.

At the beginning of the annotation procedure, the annotation platform 124 may display a building identification guide 302 to guide the user toward annotating the correct building (i.e., to allow the user to identify the correct building 112 in an image that depicts several other buildings, i.e., step 402 of FIG. 4). As shown in FIG. 3A, the annotation platform 124 displays a building identification guide 302 in both the left image 210 and the right image 212.

In the present example, the building identification guide 302 comprises a preliminary building footprint polygon that is georeferenced to the images and is projected into the images to indicate an approximate location of the correct building 112 to be annotated. This building footprint polygon may be understood to be preliminary in the sense that it may be only a two-dimensional building footprint polygon, or even a three-dimensional building footprint polygon, but without complex roof geometry. In any case, the preliminary building footprint polygon may appear to resemble at least the general shape of the target building, and is georeferenced, thereby allowing a user to easily identify and distinguish the correct building to be annotated from other buildings that may be depicted in the same imagery. Further, the preliminary building footprint polygon may be depicted in a manner that visually distinguishes it from any annotation features that may be made over the imagery (e.g., in a different color, in dashed lines, or otherwise made visually distinct from any annotations), thereby allowing a user to easily locate the building 112. The building identification guide 302 may be stored in a separate data layer that may be disabled when not in use (e.g., after the correct building 112 has been identified).

In the case where the building identification guide 302 includes a preliminary building footprint polygon, the preliminary building footprint polygon may have been extracted from single imagery according to any suitable building footprint extraction process. Such a preliminary building footprint polygon may have been extracted from one of the images used in the annotation platform 124 or from other imagery. As for the means of extraction, the preliminary building footprint polygon may have been extracted from an image using the machine learning process described in U.S. patent application Ser. No. 17/731,769, entitled MACHINE LEARNING FOR VECTOR MAP GENERATION, filed Apr. 28, 2022, the entirety of which is hereby incorporated by reference. As mentioned above, the preliminary building footprint polygon may contain georeferenced spatial information (e.g., latitude and longitude coordinates) with which it can be projected into at least one of the images used by the annotation platform 124. Although described here as a building "footprint" polygon, the building identification guide 302 may also be a building rooftop polygon that represents the outline of the building around its rooftop, or indeed any form of two-dimensional polygonal representation of a building. In other examples, the preliminary building footprint polygon may be a preliminary 3D building model or a preliminary building footprint polygon attributed with the height of the building.

Figure 3B:
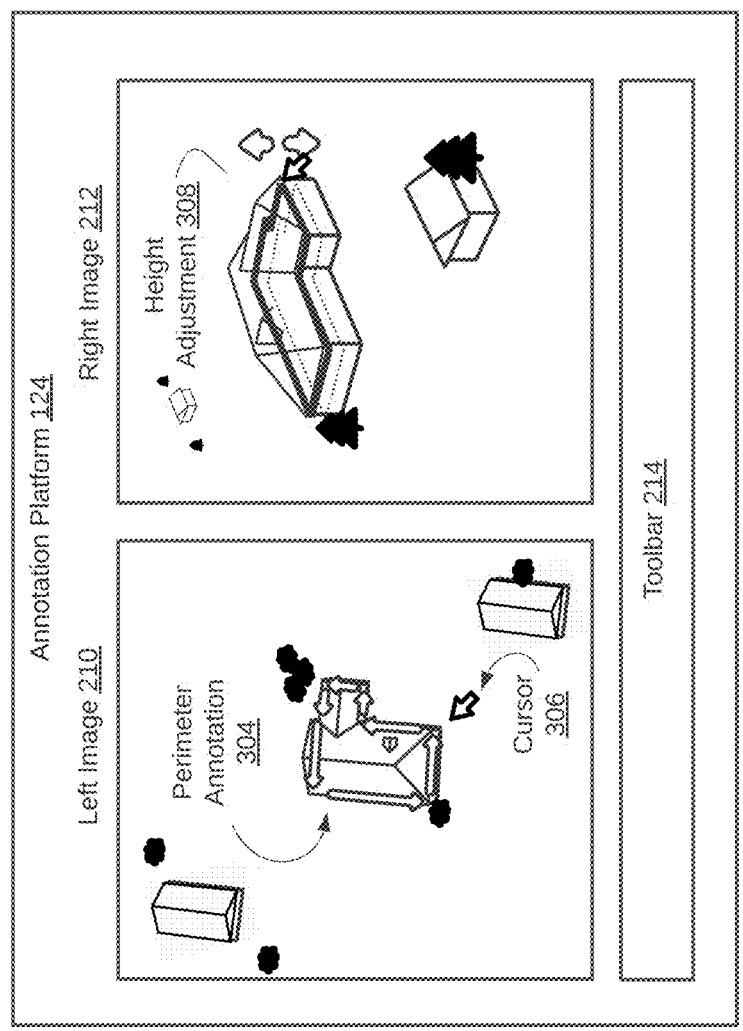

Once ready to annotate, the user may begin by defining the perimeter of a pitched roof of the building 112 (i.e., step 404 of FIG. 4). In other words, the user annotates around the base of the pitched roof, or at least surrounding the base of one major section of the roof that contains a pitched roof section. As shown in FIG. 3B, a user moves a cursor 306 (and any appropriate "draw line" or "draw roof perimeter" tool that may be selected from the toolbar 214) to annotate the perimeter of the pitched roof as depicted in the left image 210 (indicated as perimeter annotation 304). The user draws the perimeter outline over one of the images, such as the left image 210. Using the known camera parameters, the perimeter can be projected into any of the other images used by the annotation platform 124 (e.g., the right image 212) at an initial guess of the height of the building. The initial height of the perimeter may be set at an initial estimate as to the height of the building, based on other data such as a digital elevation map (DEM) or a digital surface map (DSM) over the area, or a preliminary building model (e.g., a 3D building model or height-attributed building footprint polygon), either of which may have also been generated by the image processing engine 122 in an earlier step.

With the perimeter outlined, the user then adjusts the height of the perimeter to match the height of the base of the roof as viewed from the perspective of the other image (e.g., the right image 212) (i.e., step 406 of FIG. 4). As also shown in FIG. 3B, the user may adjust the height of the perimeter by selecting the perimeter in the other image by dragging the perimeter annotation to the appropriate position (indicated as height adjustment 308). While the user is adjusting the height of the perimeter in the right image 212, the annotation platform 124 fixes the position of the perimeter with respect to the left image 210. In other words, the annotation platform 124 constrains the perimeter to slide along an epipolar line defined between the left image 210 and the right image 212 (in practice, an "average" epipolar line passing through the center of the perimeter polygon may be used). Therefore, the position of the perimeter remains unchanged as viewed from the left image 210.

Figure 3C:
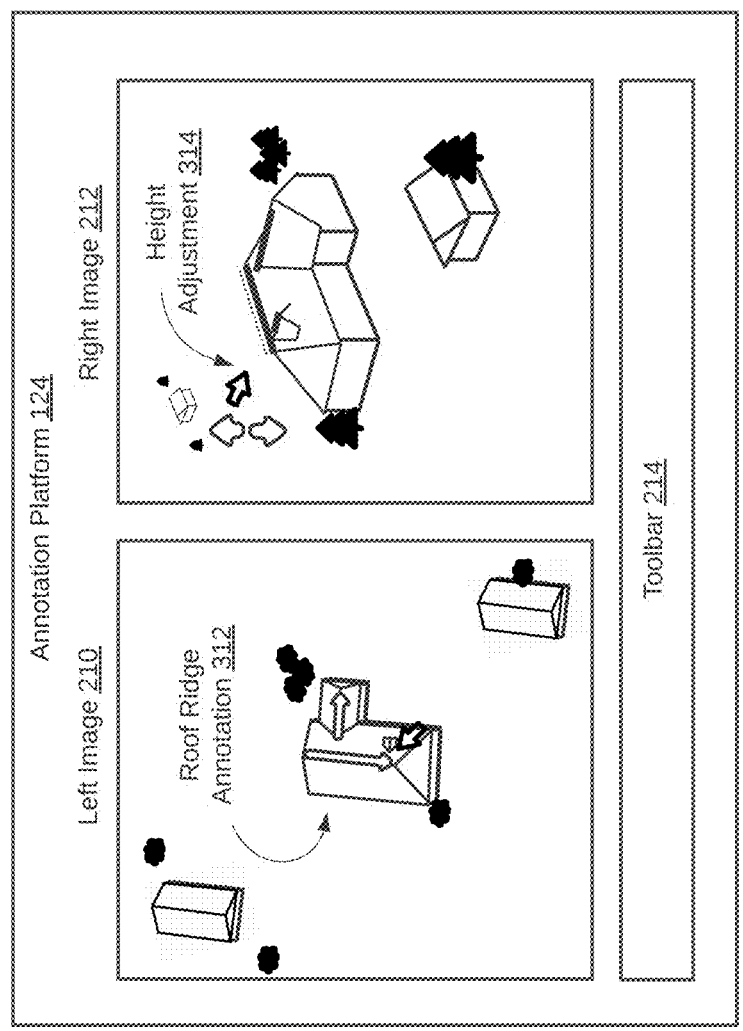
Figure 3D:
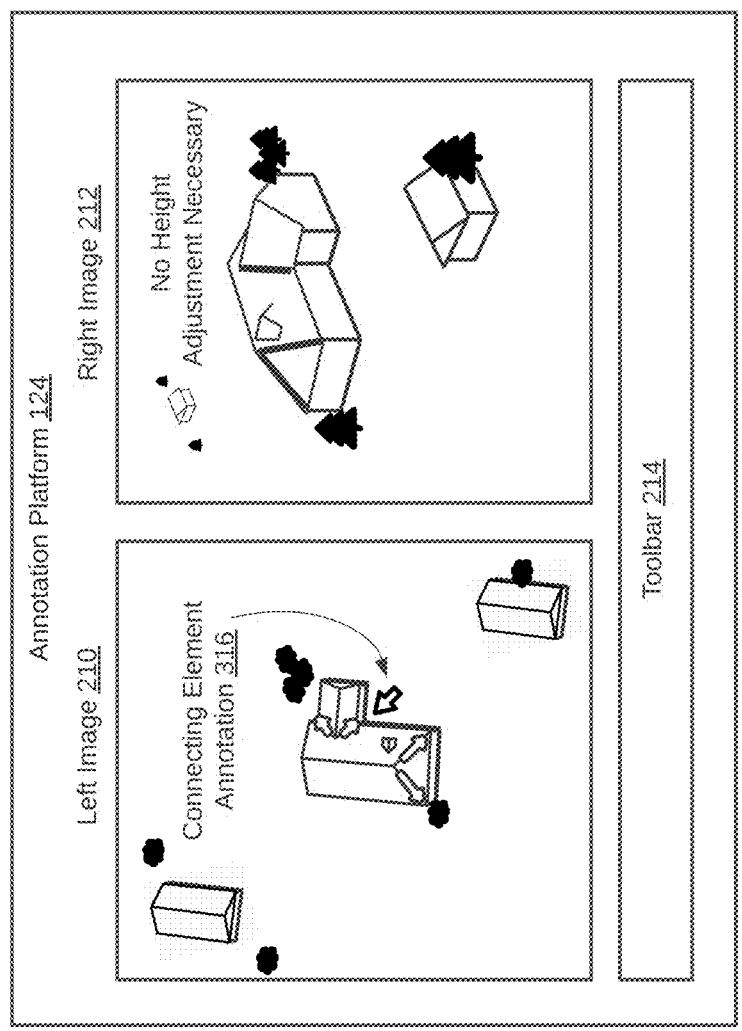

Having annotated the perimeter of the roof, the user can proceed to annotate the planar roof facets that comprise the complex pitched roof geometry (i.e., step 408 of FIG. 4). As shown in FIG. 3C, a user should generally begin the annotation procedure by defining the ridge elements of the pitched roof, preferably beginning from the highest (or most interior) ridge elements and working outward toward the perimeter. The user generally defines each ridge element separately by first annotating the ridge in the left image 210 (indicated as roof ridge annotation 312) and then adjusting the height of the ridge element in the right image 212 (indicated as height adjustment 314). During height adjustment of a ridge element, the annotation platform 124 fixes the ridge element along an epipolar line (e.g., an average epipolar line for the ridge element).

After a ridge element is completed, the user may then connect the endpoints of the ridge element to one or more lower roof elements, such as the perimeter of the roof, or to another ridge element (as shown in FIG. 3E). These connecting elements form the hips, valleys, and gables of the pitched roof structure (e.g., connecting element annotation 316). Since the three-dimensional position of the ridge element is already known, as well as the three-dimensional position of the roof element to which the ridge element is being connected, it is not necessary to perform height adjustment on these connecting elements.

Having annotated the perimeter, the ridge elements, and the connecting elements (e.g., hips, valleys, gables), the three-dimensional structure of the complex roof geometry of the pitched roof is completely defined.

It is to be emphasized that the above annotation procedure, which is summarized in the method 400 of FIG. 4, sets out one preferred workflow for annotating a building with pitched roof geometry, and is provided for example purposes only. It is contemplated that the 3D geometry of buildings with pitched roofs may be reconstructed using any of the tools described in this disclosure without necessarily following this annotation procedure.

Figure 5C:
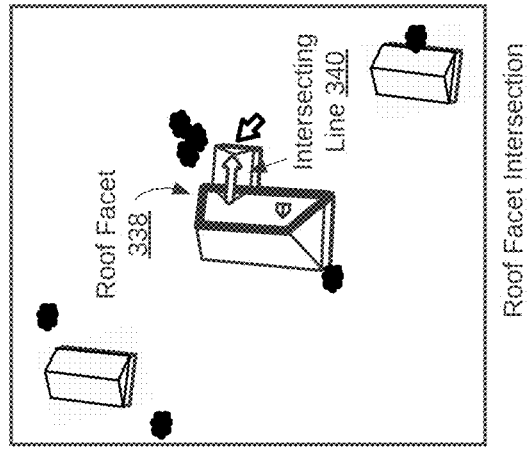
FIGS. 5A-5C are schematic diagrams depicting schematic diagrams depicting the functionality of various annotation tools for reconstructing three-dimensional roof geometry.
Figure 5B:
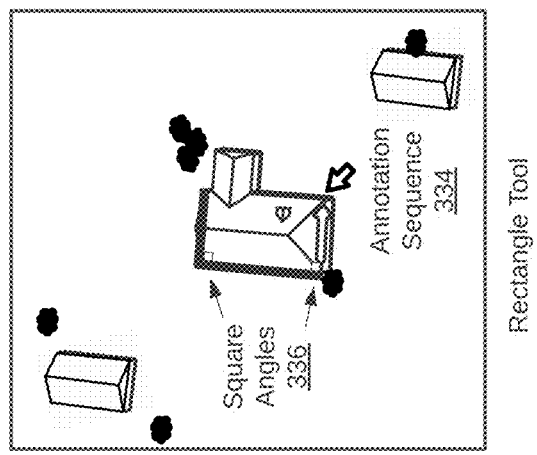
Figure 5A:
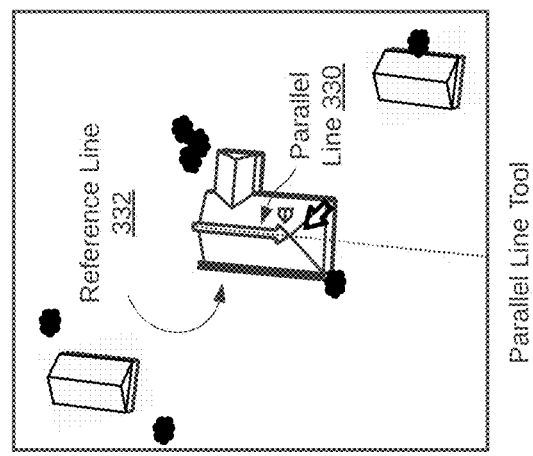

FIGS. 5A-5C are schematic diagrams depicting the functionality of various annotation tools for reconstructing three-dimensional roof geometry. These annotation tools may be offered by the annotation platform 124.

In FIG. 5A, a user is shown employing a parallel line tool. The parallel line tool may be provided through the annotation platform 124 as a means for a user to define, during annotation of a linear roof element, that the linear roof element is to be parallel to a reference linear roof element. A user may access the parallel line tool by selecting the appropriate tool through the toolbar 214 or by engaging the appropriate keyboard and/or mouse inputs. A user may employ the parallel line tool in the following way: (i) the user beings annotating a new (e.g., parallel line 330) line by indicating the starting point of the new line, (ii) before indicating the endpoint of the new line, the user engages the parallel line tool (e.g., by holding down a specific key on a keyboard), (iii) the user indicates a reference line (e.g., reference line 332) to which the new line is to be parallel, (iv) the annotation platform constrains the definition of the endpoint of the new line to be along a line that is parallel to the reference line, and (v) the user completes annotation of the new line by indicating its end point. The parallel line tool may be particularly useful for defining roof elements that can reasonably be expected to be parallel to one another in the real world. For example, a user may define a ridge line as being parallel to one of the sides of the perimeter of the roof.

In FIG. 5B, a user is shown employing a rectangle tool. The rectangle tool may be provided through the annotation platform 124 as a means for a user to define, that for a following sequence of linear roof elements, that each of the linear roof elements are to be parallel or perpendicular to one another. A user may access the rectangle tool by selecting the appropriate tool through the toolbar 214 or by engaging the appropriate keyboard and/or mouse inputs. A user may employ the rectangle tool in the following way: (i) the user annotates the first line in the sequence, (ii) the user engages the rectangle tool (e.g., by holding down a specific key on a keyboard), (iii) the annotation platform constrains the definition of the next lines in the sequence to be parallel or perpendicular to the previously-defined line, and (iv) the user continues annotating each line in the sequence (e.g., annotation sequence 334) until complete. Each line in the sequence is therefore joined to each adjacent line in the sequence by square angles 336. The rectangle tool may be particularly useful for defining a series of roof elements that can reasonably be expected to be parallel or perpendicular to one another in the real world. For example, a user may define each of the sides of the perimeter of a roof as being parallel or perpendicular to one another.

In FIG. 5C, a user is shown employing a roof facet intersection tool. The roof facet intersection tool may be provided through the annotation platform 124 as a means for a user to annotate a linear roof element as originating from a face of a planar roof facet. A user may access the roof facet intersection tool by selecting the appropriate tool through the toolbar 214 or by engaging the appropriate keyboard and/or mouse inputs. A user may employ the roof facet intersection tool in the following way: (i) following the completion of a roof facet (i.e., roof facet 338), the user engages the roof facet intersection tool (e.g., by holding down a specific key on a keyboard), (iii) the annotation platform constrains the definition of the starting point of the next line as originating from a point on the roof facet, (iv) the user selects the starting point for the new line on the roof facet (now fixed in three-dimensional space), and (v) the user completes the definition of the new line by selecting its endpoint. In some cases, the annotation platform may also constrain the definition of the end point of the new line as falling within the same XY plane as the starting point (i.e., at the same height), to capture the common case where a ridge line branches from a roof facet in a direction parallel to the ground. The roof facet intersection tool may be particularly useful for defining roof elements that join at pre-defined roof facets. For example, a user may define a ridge element as originating from a roof facet (e.g., intersecting line 340).

Thus, the present disclosure therefore provides systems and methods for generating geometric models of buildings with complex roof geometry. In particular, an annotation platform may be used with the various annotation tools and procedures described herein, to reconstruct complex roof geometry, such as the geometry of pitched roofs.

It should be recognized that features and aspects of the various examples provided above can be combined into further examples that also fall within the scope of the present disclosure. The scope of the claims should not be limited by the above examples but should be given the broadest interpretation consistent with the description as a whole.

The invention claimed is:

1. A method for generating a geometric model of a pitched roof of a building based on multiview imagery, wherein the method comprises:
    establishing a three-dimensional coordinate space for the multiview imagery;
    displaying, through an annotation platform, multiview imagery depicting the pitched roof from different points of view; and
    providing, through the annotation platform, functionality for a user to provide user input comprising instructions to:
        define a perimeter of the pitched roof by: annotating a perimeter of the pitched roof around a base of the pitched roof as depicted in at least one image of the multiview imagery, and adjusting a height of the perimeter in the three-dimensional coordinate space to match a height of the base of the pitched roof as depicted in at least one other image of the multiview imagery;
        define a ridge line of the pitched roof by: annotating a ridge line of the pitched roof as depicted in at least one image of the multiview imagery, and adjusting a height of the ridge line in the three-dimensional coordinate space to match a height of the ridge line as depicted in at least one other image of the multiview imagery; and
        define at least part of a roof facet of the pitched roof by connecting the ridge line of the pitched roof to the perimeter of the pitched roof.

2. The method of claim 1, wherein the annotation platform provides functionality for the user to provide input comprising instructions to define the at least part of the roof facet by connecting an end point of the ridge line to a point along the perimeter of the pitched roof.

3. The method of claim 1, further comprising:
    providing, through the annotation platform, functionality for a user to define, during annotation of a first linear roof element, that the first linear roof element is to be parallel to a second linear roof element.

4. The method of claim 1, further comprising:
    providing, through the annotation platform, functionality for a user to define, that for a following sequence of linear roof elements to be annotated, that each of the linear roof elements are to be parallel or perpendicular to one another.

5. The method of claim 1, wherein the geometric model of the pitched roof comprises a roof facet, and wherein the method further comprises:
    providing, through the annotation platform, functionality for a user to annotate a linear roof element as originating from a face of the roof facet.

6. The method of claim 1, wherein the multiview imagery comprises a stereoscopic pair.

7. The method of claim 1, wherein at least one image of the multiview imagery is captured from an overhead point of view, and at least one other image of the multiview imagery is captured from an oblique point of view.

8. The method of claim 1, further comprising:
    prior to receiving the user input, displaying, through the annotation platform, a building identification guide in at least one of the images of the multiview imagery to assist the user of the annotation platform to locate the building for annotation.

9. The method of claim 8, wherein the building identification guide comprises a two-dimensional polygonal representation of the building that is georeferenced to at least one of the images of the multiview imagery and is projected into at least one other image of the multiview imagery.

10. The method of claim 9, further comprising:
prior to displaying the building identification guide, applying a machine learning model to extract the two-dimensional polygonal representation from the at least one of the images of the multiview imagery.

11. A system for generating a geometric model of a pitched roof of a building based on multiview imagery, the system comprising one or more computing devices configured to:
establish a three-dimensional coordinate space for the multiview imagery;
display, through an annotation platform, multiview imagery depicting the pitched roof from different points of view; and
provide, through the annotation platform, functionality for a user to provide user input comprising instructions to:
define a perimeter of the pitched roof by: annotating a perimeter of the pitched roof around a base of the pitched roof as depicted in at least one image of the multiview imagery, and adjusting a height of the perimeter in the three-dimensional coordinate space to match a height of the base of the pitched roof as depicted in at least one other image of the multiview imagery;
define a ridge line of the pitched roof by: annotating a ridge line of the pitched roof as depicted in at least one image of the multiview imagery, and adjusting a height of the ridge line in the three-dimensional coordinate space to match a height of the ridge line as depicted in at least one other image of the multiview imagery; and
define at least part of a roof facet of the pitched roof by connecting the ridge line of the pitched roof to the perimeter of the pitched roof.

12. The system of claim 11, wherein the annotation platform provides functionality for the user to provide input comprising instructions to define the at least part of the roof facet by connecting an end point of the ridge line to a point along the perimeter of the pitched roof.

13. The system of claim 11, wherein the geometric model of the pitched roof comprises a roof facet, and wherein the one or more computing devices are further configured to:
provide, through the annotation platform, functionality for a user to annotate a linear roof element as originating from a face of the roof facet.

14. The system of claim 11, wherein the multiview imagery comprises a stereoscopic pair.

15. The system of claim 11, wherein at least one image of the multiview imagery is captured from an overhead point of view, and at least one other image of the multiview imagery is captured from an oblique point of view.

16. At least one non-transitory machine-readable storage medium comprising instructions that when executed cause one or more processors to:
establish a three-dimensional coordinate space for a set of multiview imagery;
display, through an annotation platform, multiview imagery depicting a pitched roof from different points of view; and
provide, through the annotation platform, functionality for a user to provide user input comprising instructions to:
define a perimeter of the pitched roof by: annotating a perimeter of the pitched roof around a base of the pitched roof as depicted in at least one image of the multiview imagery, and adjusting a height of the perimeter in the three-dimensional coordinate space to match a height of the base of the pitched roof as depicted in at least one other image of the multiview imagery;
define a ridge line of the pitched roof by: annotating a ridge line of the pitched roof as depicted in at least one image of the multiview imagery, and adjusting a height of the ridge line in the three-dimensional coordinate space to match a height of the ridge line as depicted in at least one other image of the multiview imagery; and
define at least part of a roof facet of the pitched roof by connecting the ridge line of the pitched roof to the perimeter of the pitched roof.

17. The at least one non-transitory machine-readable storage medium of claim 16, wherein the instructions when executed further cause the one or more processors to provide, through the annotation platform, functionality for the user to provide input comprising instructions to define the at least part of the roof facet by connecting an end point of the ridge line to a point along the perimeter of the pitched roof.

18. The at least one non-transitory machine-readable storage medium of claim 16, wherein the geometric model of the pitched roof comprises a roof facet, and wherein the instructions when executed further cause the one or more processors to:
provide, through the annotation platform, functionality for a user to annotate a linear roof element as originating from a face of the roof facet.

19. The at least one non-transitory machine-readable storage medium of claim 16, wherein the multiview imagery comprises a stereoscopic pair.

20. The at least one non-transitory machine-readable storage medium of claim 16, wherein at least one image of the multiview imagery is captured from an overhead point of view, and at least one other image of the multiview imagery is captured from an oblique point of view.

* * * * *